United States Patent
Handa et al.

(10) Patent No.: US 7,893,764 B2
(45) Date of Patent: Feb. 22, 2011

(54) POWER AMPLIFIER AND COMMON MODE CHOKE COIL APPARATUS

(75) Inventors: Takashi Handa, Jakarta Selatan (ID); Toshiro Mayuzumi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 15 days.

(21) Appl. No.: 12/535,634

(22) Filed: Aug. 4, 2009

(65) Prior Publication Data
US 2010/0033248 A1   Feb. 11, 2010

(30) Foreign Application Priority Data
Aug. 6, 2008  (JP) .............................. 2008-202927

(51) Int. Cl.
*H03F 21/00*  (2006.01)
(52) U.S. Cl. .................................. 330/207 A; 330/251
(58) Field of Classification Search ............. 330/207 A, 330/251, 10, 146
See application file for complete search history.

(56) References Cited

U.S. PATENT DOCUMENTS

| 6,856,192 B2 * | 2/2005 | Muramatsu | 330/10 |
| 7,471,144 B2 * | 12/2008 | Lipcsei | 330/10 |
| 7,501,889 B2 * | 3/2009 | Mendenhall | 330/251 |
| 2002/0196078 A1 | 12/2002 | Honda et al. | |
| 2003/0020539 A1 | 1/2003 | Sawashi | |
| 2003/0067349 A1 | 4/2003 | Muramatsu | |

FOREIGN PATENT DOCUMENTS

| JP | 2002-330035 | 11/2002 |
| JP | 2003-046345 | 2/2003 |
| JP | 2003-124029 | 4/2003 |

* cited by examiner

*Primary Examiner*—Henry K Choe
(74) *Attorney, Agent, or Firm*—Morrison & Foerster LLP

(57) ABSTRACT

Common mode choke coil device includes four coils wound on a core in a same direction. Hot-side outputs of first and second class-D amplifiers are connected to respective ones of first ends of two of the four coils, and first and second hot-side output terminals are connected to respective ones of second ends of the two coils. Ground-side outputs of the first and second class-D amplifiers are connected to respective ones of the first ends of remaining two of the four coils, and first and second ground-side output terminals are connected to respective ones of the second ends of the remaining two coils. Single-end connection is realized by connecting a separate load to each of the class-D amplifiers via the corresponding first (or second) hot-side and ground-side output terminals. BTL connection is realized by connecting a single load to the class-D amplifiers via the first and second hot-side output terminals.

14 Claims, 4 Drawing Sheets

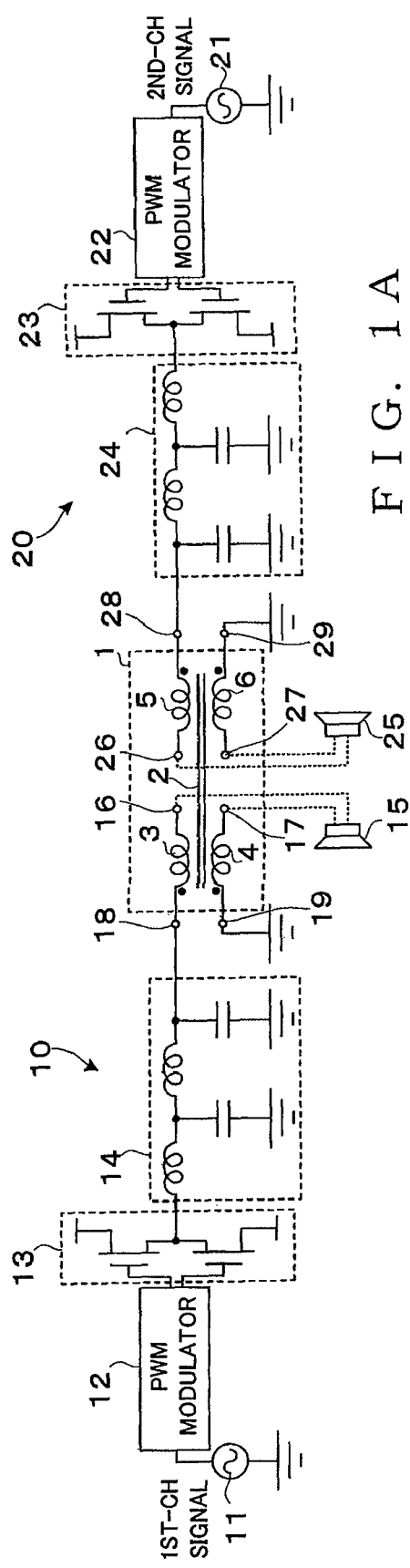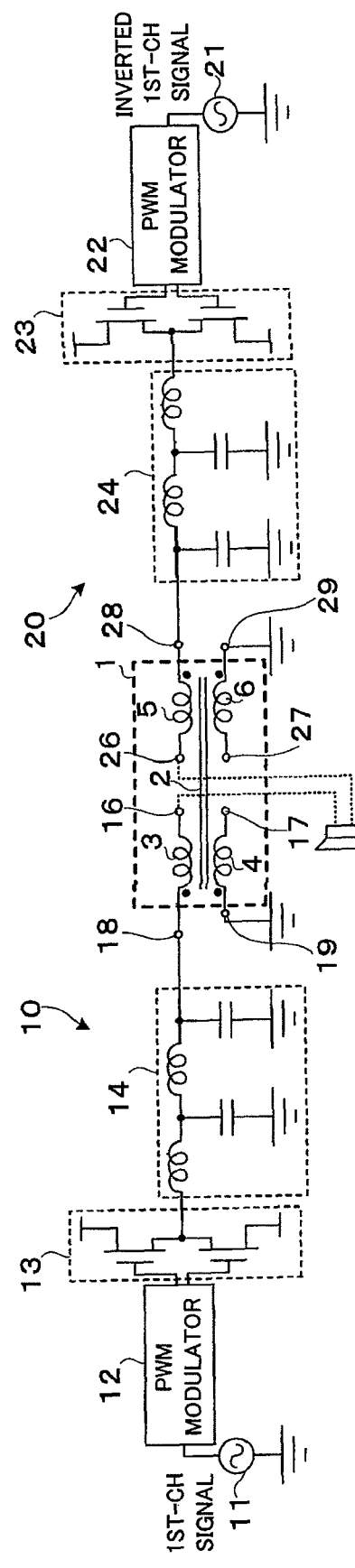

POWER AMPLIFIER AND COMMON MODE CHOKE COIL APPARATUS

BACKGROUND

The present invention relates generally to techniques for removing noise in power amplifiers comprising class-D amplifiers and more particularly to a common mode choke coil apparatus for use in a power amplifier.

In the field of audio amplifiers, there have heretofore been known class-D amplifiers using a class-D amplification method. The class-D amplifier is an amplifier for amplifying electric power on the basis of the class-D operation scheme or mode, which converts an input analog sound signal into a pulse width modulated signal (PWM signal) and performs ON-OFF control on an output-stage switching element in accordance with the pulse width modulated signal. Low-pass filter is provided at a stage following the output-stage switching element, and this low-pass filter removes a carrier frequency included in an output switching signal to demodulate the output switching signal to the analog sound signal and then outputs the demodulated analog sound signal to a load, such as a speaker.

As well known in the art, among various schemes or modes for connecting a speaker to an audio amplifier are a single-end connection (half-bridge connection) mode and a BTL connection (full-bridge connection) mode; "BTL" is an acronym for Bridge-Tied Load or Balanced Transformer Less).

In the case of the single-end connection, one speaker is connected to a class-D amplifier of one channel, and one of terminals of the speaker is connected to the ground. Where a power amplifier for handling stereo signals of two channels is to be constructed using such class-D amplifiers designed for single-end connection (hereinafter sometimes referred to as "single-end connecting class-D amplifiers"), two class-D amplifiers are provided in one-to-one corresponding relation to the two channels (see, for example, FIG. 1 of Japanese Patent Application Laid-open Publication No. 2002-330035 (hereinafter referred to as "Patent Literature 1")). In the case of the BTL connection, one speaker is bridge-connected to two class-D amplifiers of two channels, signals of opposite phases are input to the two class-D amplifiers, and the one speaker is driven differentially by the signals of opposite phases output from the two class-D amplifiers (see, for example, FIG. 4 of Patent Literature 1).

Further, among various types of conventionally-known class-D amplifiers is one where a common mode choke coil (CMC coil) is provided at a stage following a low-pass filter (see, for example, Japanese Patent Application Laid-open Publication No. 2003-124029 (hereinafter referred to as "Patent Literature 2") and Japanese Patent Application Laid-open Publication No. 2003-46345 (hereinafter referred to as "Patent Literature 3")). With the common mode choke coil provided at the stage following the low-pass filter, it is possible to remove noise components (common mode noise), such as high-frequency noise, that are transmitted in a common mode without having been removed by the low-pass filter. Note that the noise components transmitted in the common mode (common mode noise) are noise currents flowing in phase with each other through a hot-side output line and ground-side output line of the class-D amplifier. The common mode noise is included, for example, in switching noise produced by switching operation of a PWM modulation stage and an output stage. Therefore, in the class-D amplifier, measures against the common mode noise are important.

FIG. 5 is a diagram showing an example arrangement where a CMC coil is provided in a single-end connecting class-D amplifier. The CMC coil 50 includes two windings 52 and 53 wound on a single core 51 in the same phase direction, and one of the windings 52 is connected to the hot-side output of the class-D amplifier while the other winding 53 is connected to the ground-side output of the class-D amplifier in the same phase direction as the one winding 52. Thus, common mode currents (noise components), transmitted in the common mode, flow over the hot-side winding 52 and ground-side winding 53 in phase with each other, so that magnetic fluxes are produced in the two windings 52 and 53 in the same direction. Consequently, magnetic fluxes of the core 51 are added together to produce a great impedance. Thus, the CMC coil 50 prevents propagation of the common mode noise. For a current transmitted in a normal mode (i.e., output signal of the class-D amplifier), on the other hand, because a current flowing through the hot-side winding 52 to a speaker and a current flowing from the speaker to the ground-side winding 53 in an opposite direction to the former current counterbalance each other, magnetic fluxes produced in the hot-side winding 52 and the ground-side winding 53 cancel out each other. Thus, the CMC coil 50 permits passage therethrough of the output signal of the class-D amplifier without producing impedance to the current transmitted in the normal mode (i.e., output signal of the class-D amplifier). In this way, the core 51 of the CMC coil 50 is not saturated with magnetic fluxes with respect to the output signal of the class-D amplifier. In other words, since the great impedance to common mode noise due to saturation of magnetic fluxes is produced, only the common mode noise included in the output signal of the class-D amplifier can be effectively removed or reduced.

FIG. 6 is an example arrangement where a CMC coil is connected to class-D amplifiers designed for the BTL connection (hereinafter sometimes referred to as "BTL connecting class-D amplifiers"). In the BTL-connecting class-D amplifier, two windings 54 and 55 of the CMC coil are connected to respective outputs of the two class-D amplifiers. In the case of the BTL connection, respective output signals of the two class-D amplifiers are of opposite phases, and thus currents flowing through the windings 54 and 55 counterbalance each other so that magnetic fluxes produced in a core 56 cancel out each other. Thus, magnetic fluxes of the core 56 of the CMC coil 57 do not saturate with respect to the output signals of the class-D amplifiers. With respect to common noise included in the output signals of the class-D amplifiers, on the other hand, common mode noise current components of the same phase flow through the windings 54 and 55 to produce a great impedance, so that the common mode noise can be effectively removed.

FIG. 7A shows an arrangement where an audio amplifier (power amplifier) is constructed, using two single-end connecting class-D amplifiers each having a CMC coil as shown in FIG. 5, in such a manner that it is selectively switchable between the single-end connection mode for reproducing two-channel stereo signals and the BTL connection mode for reproducing a one-channel monaural signal, and where the thus-constructed audio amplifier is used in the single-end connection mode. In each of the CMC coils 62 and 63 provided in the two class-D amplifiers 60 and 61, currents flowing through the hot-side winding and ground-side winding counterbalance with each other so that magnetic fluxes do not saturate; thus, the CMC coils 62 and 63 can operate appropriately.

However, if the audio amplifier (power amplifier) shown in FIG. 7A is to be used in the BTL connection mode, a speaker is connected to hot-side output terminals 64 and 65 of the two class-D amplifiers 60 and 61 as shown in FIG. 7B. Thus, in this case, currents flow only through the hot-side windings of the CMC coils 62 and 63 provided in the two class-D amplifiers 60 and 61. Consequently, magnetic fluxes of the cores of the CMC coils 62 and 63 would saturate, so that the CMC coils 62 and 63 can not operate appropriately or effectively. Thus, with the prior art technique, the audio amplifier (power amplifier) provided with two single-end connecting class-D amplifiers having the respective CMC coils could not be used in the BTL connection mode.

Further, if two BTL-connecting class-D amplifiers having a CMC coil as shown in FIG. 6 are used in the single end connection mode where a speaker is driven independently per channel, the two class-D amplifiers output signals of different channels independently of each other, and thus, magnetic fluxes of the core 56 may saturate, for example, when electric currents of the same phase flow through the two windings 54 and 55 of the CMC coil 57, which would prevent the CMC coil 57 from operating effectively. Thus, heretofore, such usage of the class-D amplifiers has been impossible.

Namely, with the prior art technique, it has been impossible to construct a power amplifier (audio amplifier) which includes two class-D amplifiers and a CMC coil and of which a user can select as desired any one of two connection schemes or modes, i.e. single-end connection mode and BTL connection mode (i.e., which is switchable, through operation by the user, between the single-end connection mode and the BTL connection mode).

SUMMARY OF THE INVENTION

In view of the foregoing, it is an object of the present invention to provide an improved power amplifier which includes two class-D amplifiers, and which can remove common mode noise using a common mode choke coil device and does not adversely influence a normal signal no matter whether it is used in the single-end connection mode or in the BTL connection mode.

In order to accomplish the above-mentioned object, the present invention provides an improved power amplifier having class-D amplifiers of two channels built therein, which comprises: a first class-D amplifier including a low-pass filter provided in an output section thereof; a first hot-side output terminal; a first ground-side output terminal; a second class-D amplifier including a low-pass filter provided in an output section thereof; a second hot-side output terminal; a second ground-side output terminal; and a common mode choke coil device including four coils wound on a common core in a same direction, each of the four coils having first and second ends, wherein hot-side outputs of the first and second class-D amplifiers are connected to respective ones of the first ends of two of the four coils, and the first and second hot-side output terminals are connected to respective ones of the second ends of the two coils, and wherein ground-side outputs of said first and second class-D amplifiers are connected to respective ones of the first ends of remaining two of the four coils, and the first and second ground-side output terminals are connected to respective ones of the second ends of the remaining two coils.

According to the present invention, when the power amplifier of the present invention is used in the "single-end connection" mode where a first load, e.g. a speaker, is connected to the first class-D amplifier via the first hot-side and ground-side output terminals and a second load, e.g. another speaker, is connected to the second class-D amplifier via the second hot-side and ground-side output terminals, the hot-side and ground-side outputs of the first class-D amplifier are connected to the first load via two coils (namely, first and second coils) connected to the first hot-side and ground-side terminals, and the hot-side and ground-side outputs of the second class-D amplifier are connected to the second load via other two coils (namely, third and fourth coils) connected to the second hot-side and ground-side terminals. Thus, in the case of the single-end connection mode, currents responsive to an output signal of the first class-D amplifier flow in mutually inverse directions through the first and second coils, and magnetic fluxes produced by the first and second coils are canceled each other due to the same direction of their windings. Also, currents responsive to an output signal of the second class-D amplifier flow in mutually inverse directions through the third and fourth coils, and magnetic fluxes produced by the third and fourth coils are canceled each other due to the same direction of their windings. With respect to common noise included in the output signal of the first (or second) class-D amplifier, on the other hand, common mode noise current components of the same phase flow through the first and second (or third and fourth) coils to produce a great impedance, so that the common mode noise can be effectively removed. Thus, in the case of the single-end connection mode, the common mode choke coil device, like the conventionally-known common mode choke coils, does not produce impedance to normal signals flowing through the load, but produces a great impedance to common mode noise due to saturation of magnetic fluxes, so that the common mode noise can be removed or reduced.

Further, according to the present invention, the first and third coils connected to the first and second hot-side terminals are wound on the magnetic core in the same direction. Thus, as another form of the use, the power amplifier of the present invention can be applied to or used in the "BTL connection" mode in which two class-D amplifiers designed for BTL connection are connected to a single load. According to the present invention, the first coil of the common mode choke coil device is connected between the hot-side output of the first class-D amplifier and the first hot-side output terminal, and similarly, the third coil of the common mode choke coil device is connected between the hot-side output of the second class-D amplifier and the second hot-side output terminal. Thus, the "BTL connection" can be realized by connecting the first and second hot-side output terminals to a single load. Further, in the present invention, the first and third coils connected to the first and second hot-side terminals are wound on the magnetic core in the same direction as noted above, and thus, in the "BTL connection" mode, the common mode choke coil section, like the conventionally-known common mode choke coils, does not produce impedance to normal signals applied in opposite phases from the individual class-D amplifiers to the load due to cancellation of magnetic fluxes, but produces a great impedance to common mode noise of the same phase due to saturation of magnetic fluxes, so that the common mode noise can be removed or reduced.

Therefore, no matter whether the power amplifier of the present invention is used in the single-end connection mode or in the BTL connection mode, the power amplifier of the present invention not only can remove the common mode noise using the common mode choke coil, but also does not adversely influence the normal signals.

According to another aspect of the present invention, there is provided an improved common mode choke coil device for connection to output sections of a first class-D amplifier and a second class-D amplifier, which comprises: a common core; four coils wound on the common core in a same direction, each of the four coils having first and second ends, wherein hot-side outputs of the first and second class-D amplifiers are connected to respective ones of the first ends of two of the four coils, and the first and second hot-side output terminals are connected to respective ones of the second ends of the two coils, and wherein ground-side outputs of said first and second class-D amplifiers are connected to respective ones of the first ends of remaining two of the four coils, and the first and second ground-side output terminals are connected to respective ones of the second ends of the remaining two coils.

If a power amplifier is constructed in the aforementioned manner using the common mode choke coil device of the present invention, it is possible to remove the common mode noise using the common mode choke coil, but also avoid adverse influences on the normal signals, no matter whether the power amplifier of the present invention is used in the single-end connection mode or in the BTL connection mode.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which:

FIG. 1A is a circuit diagram showing an example arrangement where an embodiment of a power amplifier of the present invention is used in a single-end connection mode;

FIG. 1B is a circuit diagram showing an example arrangement where the embodiment of the power amplifier of the present invention is used in a BTL connection mode;

DETAILED DESCRIPTION

Figure 2:
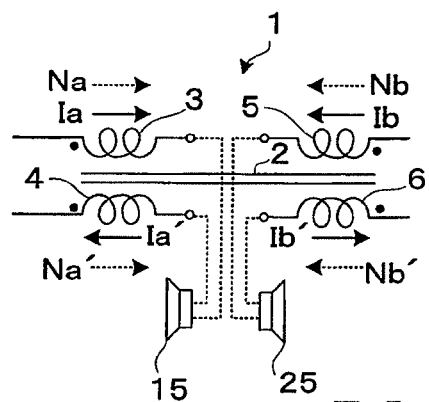
FIG. 2 is a diagram showing a common mode choke coil device of FIG. 1A in enlarged scale.

Power amplifier of the present invention to be described below is an audio amplifier. FIGS. 1A and 1B are circuit diagrams showing an example construction of the power amplifier according to an embodiment of the present invention, of which FIG. 1A shows an example arrangement where the power amplifier is used in a single-end connection (half-bridge connection) mode while FIG. 1B shows an example arrangement where the power amplifier is used in a BTL (full-bridge connection) mode. The power amplifier includes: a first class-D amplifier 10; a second class-D amplifier 20; a common mode choke coil device (hereinafter also referred to as "CMC coil") 1 constructed according to the present invention; a first terminal pair comprising a first hot-side output terminal 16 and a first ground-side output terminal 17; and a second terminal pair comprising a second hot-side output terminal 26 and a second ground-side output terminal 27. In the first terminal pair, which is provided in correspondence with the first class-D amplifier 10, the first hot-side output terminal 16 functions as a speaker output terminal corresponding to a hot-side output 18 of the first class-D amplifier 10, and the first ground-side output terminal 17 functions as a speaker output terminal corresponding to a ground-side output 19 of the first class-D amplifier 10. Further, in the second terminal pair, which is provided in correspondence with the second class-D amplifier 20, the second hot-side output terminal 26 functions as a speaker output terminal corresponding to a hot-side output 28 of the second class-D amplifier 20, and the second ground-side output terminal 27 functions as a speaker output terminal corresponding to a ground-side output 29 of the second class-D amplifier 20.

When the embodiment of the power amplifier is to be used in the single-end connection mode, a first speaker 15 is connected to the first hot-side output terminal 16 and first ground-side output terminal 17 of the first class-D amplifier 10, and a second speaker 25 is connected to the second hot-side output terminal 26 and second ground-side output terminal 27 of the second class-D amplifier 20. The first class-D amplifier 10 amplifies an input signal of a first channel (i.e., 1st-ch signal) and outputs the thus-amplified signal to the first speaker 15. The second class-D amplifier 20 amplifies an input signal of a second channel (i.e., 2nd-ch signal) and outputs the thus-amplified signal to the second speaker 25. Namely, when used in the single-end connection mode, the power amplifier can reproduce audio signals of two channels (e.g., stereo reproduction).

Figure 5:
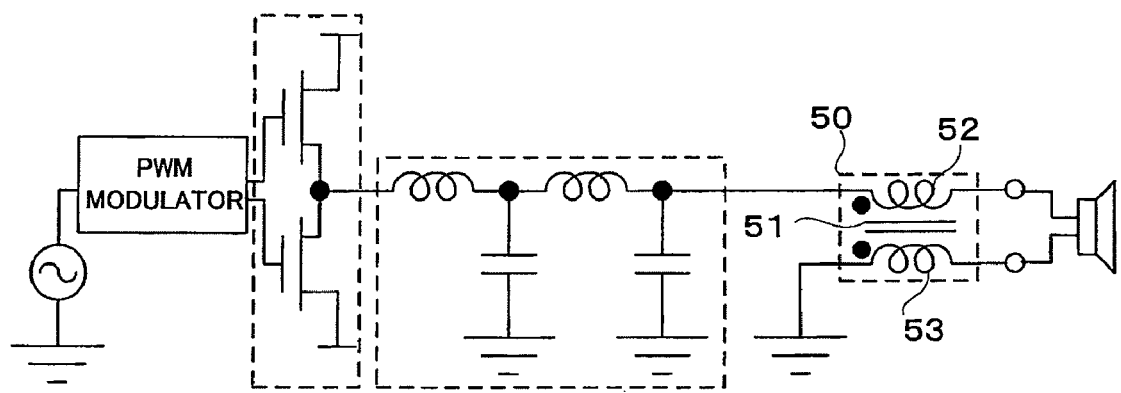
FIG. 5 is a circuit diagram showing an example construction of a single-end connecting class-D amplifier provided with a conventionally-known common mode choke coil.
Figure 6:
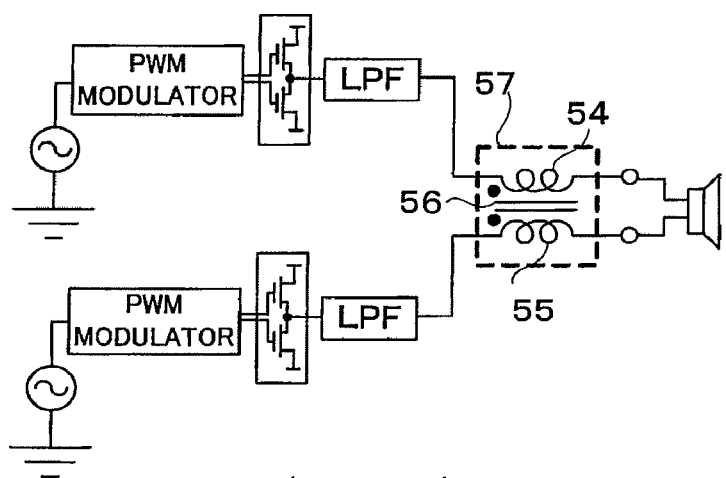
FIG. 6 is a circuit diagram showing an example construction of BTL connecting class-D amplifiers provided with a conventionally-known common mode choke coil.
Figure 7:
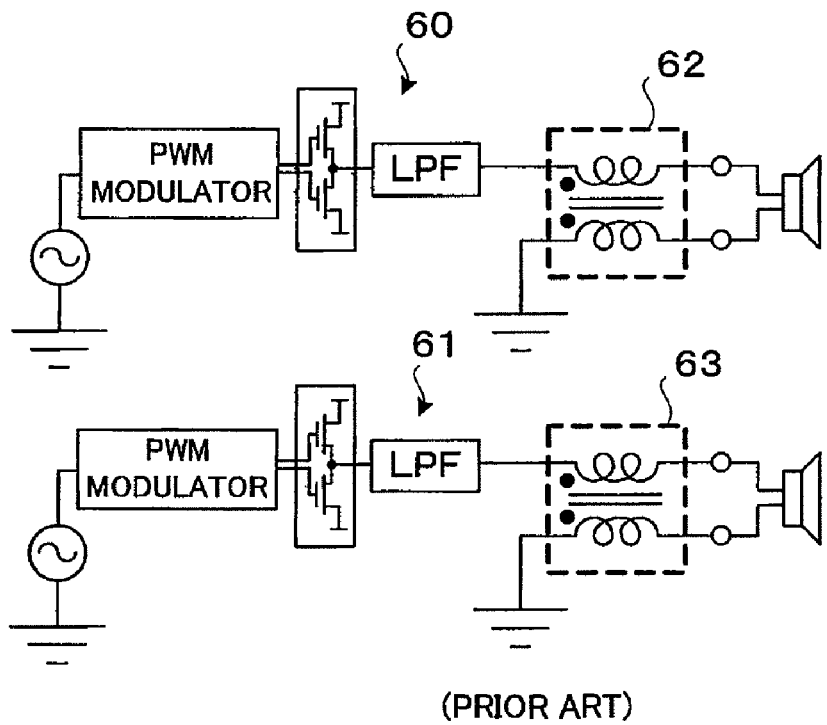
FIG. 7A is a circuit diagram showing a construction of a power amplifier including two class-D amplifiers of FIG. 5 provided in parallel to each other.
FIG. 7B is a circuit diagram showing a construction of the power amplifier of FIG. 7A when the power amplifier is to be used in the BTL connection mode.
Figure 7:
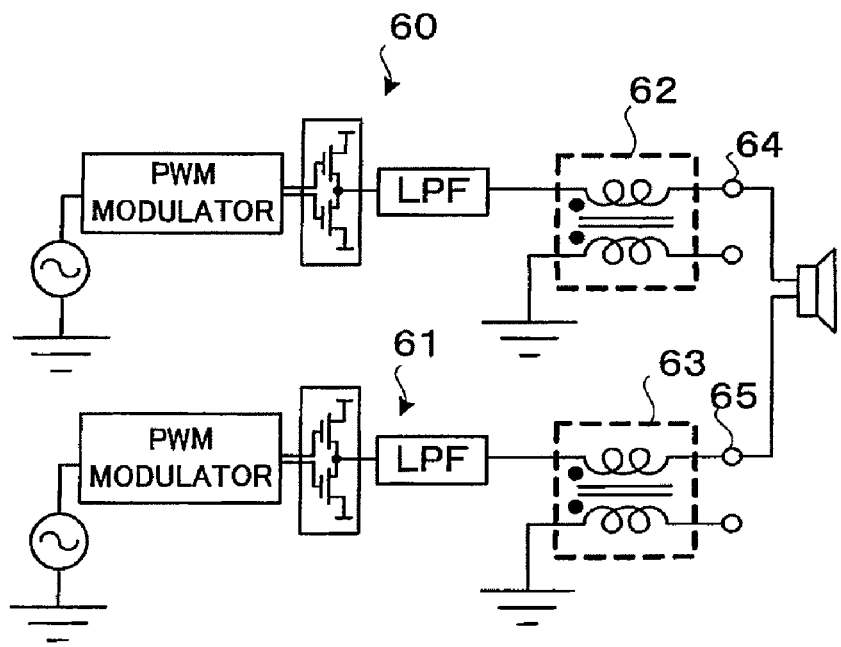

The first class-D amplifier 10 includes a supply source 11 for supplying an input signal of a first channel (i.e., 1st-ch signal), a PWM modulation circuit 12, a switching circuit 13, and a low-pass filter 14 provided in an output section of the first class-D amplifier 10. Such a construction of the first class-D amplifier 10 is similar to the construction of the conventionally-known single-end connecting class-D amplifiers as illustrated in FIG. 5 etc.

The supply source 11 supplies an analog sound signal as the input signal (1st-ch signal). The PWM modulation circuit 12 pulse-width modulates the 1st-ch signal supplied from the supply source 11. Pulse-width modulated signal (PWM signal) output from the PWM modulation circuit 12 is a binary digital signal indicative of a voltage level of the 1st-channel signal by a ratio between a high pulse width and a low pulse width.

The switching circuit 13 includes two push-pull switching elements, and positive and negative power supplies for supplying a power supply voltage to the switching elements. Usually, the switching elements are each in the form of a transistor (e.g., power MOSFET). In the switching circuit 13, the two switching elements are controlled to be turned on and off alternately at time intervals corresponding to the pulse width of the input PWM signal, to thereby produce output switching signals power-amplified using the electric power supplied by the power supply.

In the illustrated example, the low-pass filter 14 is in the form of a fourth-order LC-type low-pass filter comprising an inductor and a capacitor, and it is inserted between the output-stage switching circuit 13 and the first speaker 15. The low-pass filter 14 removes a carrier frequency from the output switching signal (PWM signal) to demodulate the output switching signal into an analog sound signal. In this way, a power-amplified analog sound signal (1st-ch signal) can be output to the first speaker 15.

The second class-D amplifier 20 includes a supply source 21 for supplying an input signal of a second channel (i.e., 2nd-ch signal), a PWM modulation circuit 22, a switching circuit 23, and a low-pass filter 24 provided in an output section of the second class-D amplifier 20. Namely, the second class-D amplifier 20 is identical in construction to the first class-D amplifier. The second class-D amplifier 20 pulse-width modulates the 2nd-ch signal into a PWM signal by means of the PWM modulation circuit 22, ON-OFF controls switching elements of the switching circuit 23 by a PWM signal and then removes a carrier frequency from an output switching signal (PWM signal) by means of the low-pass filter 24 to demodulate the output switching signal into an analog sound signal. In this way, a power-amplified analog sound signal (2nd-ch signal) can be output to the second speaker 25.

The common mode choke coil device (CMC coil) 1 is inserted at a stage following the respective low-pass filters 14 and 24 of the first and second class-D amplifiers 10 and 20, to remove common mode noise included in the output signals of the first and second class-D amplifiers 10 and 20. Noise components (common mode noise) transmitted in a common mode are noise currents flowing, in phase with each other, through both hot-side output lines (signal lines including the hot-side outputs 18 and 28) and ground-side output lines (signal lines including the ground-side outputs 19 and 29) of the class-D amplifiers.

The CMC coil 1 includes a single common magnetic core 2, and four windings (coils) 3, 4, 5 and 6 wound on the core 2 in a same direction. As an example, the windings (coils) 3, 4, 5 and 6 are wound on the core 2 of a toroidal (doughnut) shape in the same direction. In an equivalent circuit of the CMC coil 1 of FIG. 1, small black circular marks are added at respective winding start ends of the windings (coils) 3, 4, 5 and 6 where the windings (coils) 3, 4, 5 and 6 start to be wound in the same direction, to thereby indicate the winding direction thereof. In the specification, the winding start ends of the windings (coils) 3, 4, 5 and 6 will be referred to as "first ends", and the respective other ends of the windings (coils) 3, 4, 5 and 6 will be referred to as "second ends".

If a direction from the hot-side output 18 or 28 of the class-D amplifier 10 or 20 to the hot-side output terminal 16 or 26 or a direction from the ground-side output 19 or 29 of the class-D amplifier 10 or 20 to the ground-side output terminal 17 or 27 is referred to as "forward direction", the four windings 3-6 are connected between the hot-side output 18 or 28 and the hot-side output terminal 16 or 26 or between the ground-side output 19 or 29 and the ground-side output terminal 17 or 27 in such a manner that the windings 3-6 extend in phase with one another with respect to the forward direction (see the positions of the small black circular marks indicating the "first ends" in the figures).

More specifically, the hot-side output 18 of the first class-D amplifier 10 is connected to the first end of the winding 3, and the first hot-side output terminal 16 is connected to the second end of the winding 3. The ground-side output 19 of the class-D amplifier 10 is connected to the first end of the winding 4, and the ground-side output terminal 17 is connected to the second end of the winding 4.

Further, the hot-side output 28 of the second class-D amplifier 20 is connected to the first end of the winding 5, and the second hot-side output terminal 26 is connected to the second end of the winding 5. The ground-side output 29 of the second class-D amplifier 20 is connected to the first end of the winding 6, and the ground-side output terminal 27 is connected to the second end of the winding 6.

Namely, of the four windings 3-6, the windings 3 and 5 have the hot-side outputs 18 and 28 of the first and second class-D amplifiers 10 and 20 connected to their respective first ends and have the first and second hot-side output terminals 16 and 26 connected to their respective second ends. Here, the windings 3 and 5 will hereinafter be referred to as "hot-side coils". Further, the windings 4 and 6 have the ground-side outputs 19 and 29 of the first and second class-D amplifiers 10 and 20 connected to their respective first ends and have the first and second ground-side output terminals 17 and 27 connected to their respective second ends. Here, the windings 4 and 6 will hereinafter be referred to as "ground-side coils".

FIG. 2 is a diagram showing the CMC coil 1 in enlarged scale, with reference to which the following describe behavior of the CMC coil 1 in the case where the power amplifier is used in the single-end connection mode shown in FIG. 1A. As for an output signal of the first class-D amplifier 10 transmitted in the normal mode, a current Ia flowing in the forward direction to the first speaker 15 through the hot-side coil 3 and a current Ia' flowing in the reverse direction from the first speaker 15 to the ground-side output 19 through the ground-side coil 4 counterbalance with each other. Thus, magnetic fluxes produced in the hot-side coil 3 and ground-side coil 4 cancel out each other. As a consequence, the CMC coil 1 permits passage therethrough of the output signal of the first class-D amplifier 10 without producing impedance to the output signal.

As for common mode noise, on the other hand, common mode currents (noise components Na and Na') of the same phase flow through the hot-side coil 3 and ground-side coil 4, and thus, magnetic fluxes produced in the hot-side coil 3 and ground-side coil 4 by the common mode currents are added together. As a consequence, the CMC coil 1 produces a great impedance to the common mode noise to thereby prevent propagation of the common mode noise.

Further, as for an output signal of the second class-D amplifier 20 transmitted in the normal mode, a current Ib flowing in the forward direction to the second speaker 15 through the hot-side coil 5 and a current Ib' flowing in the reverse direction from the second speaker 25 to the ground-side output 29 through the ground-side coil 6 counterbalance with each other. Thus, magnetic fluxes produced in the hot-side coil 5 and ground-side coil 6 cancel out each other. As a consequence, the CMC coil 1 permits passage therethrough of the output signal of the second class-D amplifier 20 without producing impedance to the output signal.

As for common mode noise, on the other hand, common mode currents (noise components Nb and Nb') of the same phase flow through the hot-side coil 5 and ground-side coil 6, and thus, magnetic fluxes of the core 2 produced in the hot-side coil 5 and ground-side coil 6 by the common mode currents are added together. As a consequence, the CMC coil 1 produces a great impedance to the common mode noise to thereby prevent propagation of the common mode noise.

As set forth above, in the single-end connection mode, the CMC coil 1 produces practically no magnetic flux in the core to thereby permit passage therethrough of output signals of the first and second class-D amplifiers 10 and 20 transmitted in the normal mode, because the currents flowing through the hot-side coil 3 and ground-side coil 4 corresponding to the first class-D amplifier 10 are in opposite direction to each other and counterbalance with each other and because the currents flowing through the hot-side coil 5 and ground-side coil 6 corresponding to the second class-D amplifier 20 are in opposite direction to each other and counterbalance with each other. In this way, the core 2 is not saturated with magnetic fluxes with respect to the output signals of the class-D amplifiers. In other words, since the great impedance to common mode noise due to saturation of magnetic fluxes is produced, only the common mode noise included in the output signals of the class-D amplifiers 10 and 20 can be effectively removed in the manner as set forth above.

With reference to FIG. 1B, the following describe the CMC coil 1 in the case when the power amplifier is used in the BTL connection mode. In the case where the power amplifier is used in the BTL connection mode, one speaker 30 is connected to the first hot-side output terminal 16 of the first class-D amplifier 10 and first hot-side output terminal 26 of the second class-D amplifier 20, and a 1st-channel signal is supplied to the first class-D amplifier 10 while a signal of an opposite phase to the 1st-channel signal (i.e., inverted 1st-channel signal) is supplied to the second class-D amplifier 20. Then, the speaker 30 is driven differentially by an output signal of the first class-D amplifier 10 (i.e., 1st-channel signal) and an output signal of the second class-D amplifier 20 (i.e., inverted 1st-channel signal). Namely, in the case where the power amplifier is used in the BTL connection mode, the power amplifier monaurally reproduces an audio signal of one channel.

Figure 3:
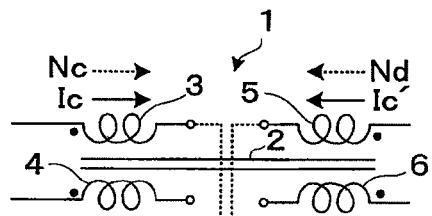
FIG. 3 is a diagram showing a common mode choke coil device of FIG. 1B in enlarged scale.

FIG. 3 is a diagram showing the CMC coil 1 in enlarged scale, with reference to which the following describe behavior of the CMC coil 1 in the case where the power amplifier is used in the BTL connection mode shown in FIG. 1B. As for an output signal (1st-channel signal) of the first class-D amplifier 10 and output signal (inverted 1st-channel signal) of the second class-D amplifier 20 transmitted in the normal mode, a current Ic corresponding to the 1st-channel signal flows through the hot-side coil 3 of the first class-D amplifier 10 and a current Ic' corresponding to the inverted 1st-channel signal (but having an opposite phase (−Ic) to the current Ic) flows through the hot-side coil 5 of the second class-D amplifier 20. Thus, the current Ic flowing through the hot-side coil 3 and the current Ic' flowing through the hot-side coil 5 are in opposite direction to each other and counterbalance with each other. Further, no current flows through the ground-side winding 4 of the first class-D amplifier 10 and ground-side winding 6 of the second class-D amplifier 20. Thus, magnetic fluxes of the core 2 produced in the hot-side coil 5 and ground-side coil 6 cancel out each other, so that the CMC coil 1, as a whole, permits passage therethrough of the output signals (1st-channel signal and inverted 1st-channel signal) of the first and second class-D amplifiers 10 and 20 without producing impedance to the output signals (1st-channel signal and inverted 1st-channel signal).

As for common mode noise in the BTL connection, on the other hand, a common mode current flowing through the hot-side coil 3 (noise component Nc) and a common mode current flowing through the hot-side coil 5 (noise component Nd) are in phase with each other, and thus, magnetic fluxes of the same direction are produced in the magnetic core 2 by the hot-side coils 3 and 5 wound on the core 2 in the same direction. Thus, the magnetic fluxes produced by the common mode currents (noise components Nc and Nd) are added together. The CMC coil 1 produces a great impedance to the common mode noise to thereby prevent propagation of the common mode noise.

As set forth above, when used in the BTL connection mode too, the CMC coil 1 can prevent saturation of the magnetic fluxes of the magnetic core 2 with respect to the output signals (1st-channel signal and inverted 1st-channel signal) of the first and second class-D amplifiers 10 and 20 and thereby minimize attenuation of the output signals due to the insertion of the CMC coil 1. The common mode noise, on the other hand, can be effectively removed.

As set forth above, in the case where the embodiment of the power amplifier of the present invention is used in the BTL connection mode, the speaker 30 is connected to the first hot-side output terminal 16 of the first class-D amplifier 10 and first hot-side output terminal 26 of the second class-D amplifier 20 as shown in FIG. 1B. In the case where the embodiment of the power amplifier is used in the single-end connection mode, on the other hand, the first speaker 15 is connected to the first hot-side output terminal 16 and first ground-side output terminal 17 of the first class-D amplifier 10, and the second speaker 25 is connected to the second hot-side output terminal 26 and second ground-side output terminal 27 of the second class-D amplifier 20, as shown in FIG. 1A. Thus, the user can select as desired any one of the single-end connection mode and BTL connection mode as a speaker connection mode of the embodiment of the power amplifier, by selecting an appropriate combination of the hot-side output terminal 16 and ground-side output terminal 17 of the first class-D amplifier 10 and the hot-side output terminal 26 and ground-side output terminal 27 of the second class-D amplifier 20. In order to facilitate such selection, a switching device is preferably provided between the output terminals (16, 17, 26 and 27) of the CMC coil 1 and the plurality of loads (speakers 15 and 25) so that any one of the single-end connection of FIG. 1A and BTL connection of FIG. 1B can be selected by switching operation of the switching device.

Figure 4A:
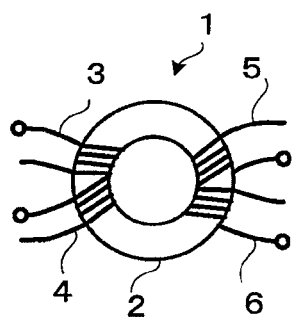
FIGS. 4A-4D are diagrams showing examples of coil arrangements of the common mode choke coil device applicable to embodiment of the power amplifier of the present invention.
Figure 4B:
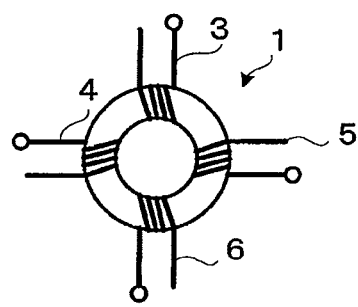

FIGS. 4A-4D show preferred examples of coil arrangements of the CMC coil 1 applied to the embodiment of the power amplifier. In FIGS. 4A and 4B, small white circular marks indicate the speaker terminals (i.e., hot-side and ground-side output terminals of the terminal pairs) of the individual windings. In the illustrated example, the CMC coil 1 includes the core 2 of a toroidal (doughnut) shape, and the hot-side coil 3 and ground-side coil 4 of the first class-D amplifier 10 are wound on one side (left side in the figure) of the toroidal-shaped core 2 in adjoining relation to each other while the hot-side coil 5 and ground-side coil 6 of the second class-D amplifier 20 are wound on the other side (right side in the figure) of the toroidal-shaped core 2 in adjoining relation to each other. If the hot-side coil 3 and ground-side coil 4 of the first class-D amplifier 10 and the hot-side coil 5 and ground-side coil 6 of the second class-D amplifier 20 are separated from each other on the toroidal-shaped core 2 as shown in FIG. 4A, the first class-D amplifier 10 and wiring of the hot-side coil 3 and ground-side coil 4 and the second class-D amplifier 20 and wiring of the hot-side coil and ground-side coil 6 can be readily visually recognized or distinguished from each other. Let it be assumed here that each of the four windings 3-6 comprises the same number of turns of a conductive line and has the same inductance.

Figure 4C:
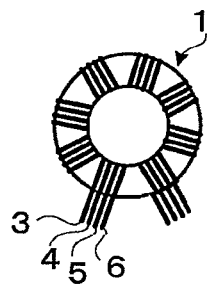
Figure 4D:
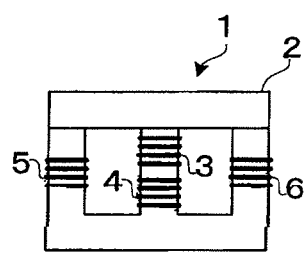

FIG. 4B shows an example arrangement where the four windings 3, 4, 5 and 6 are wound on four portions of the toroidal-shaped core 2 in a uniformly distributed fashion. FIG. 4C shows an example arrangement where four conductive lines constituting the four windings 3-6 are wound together on the core 2 by being bundled in parallel to one another. Note that the core 2 may be formed in other than the toroidal shape, such as an EI shape as seen in FIG. 4D. In the illustrated example of FIGS. 4A-4C, the magnetic core 2 has a structure constituting a single common magnetic circuit. In the illustrated example of FIG. 4D, the magnetic core 2 has a structure constituting a plurality of magnetic circuits. Note that, in the magnetic core (toroidal-shaped core) 2 having the structure constituting a single common magnetic circuit, the number of the coil pairs provided in the CMC coil 1 is not limited to two as in the above-described embodiment and may be three or more, in which case setting of the magnetic circuit can be performed with ease.

Note that the magnetic core 2 having the structure constituting a single common magnetic circuit is not limited to the above-mentioned toroidal-shaped core and may be of any other conventionally-known shape, such as the CI shape, UI shape or CC shape. Further, the magnetic core 2 having the structure constituting a plurality of magnetic circuits is not limited to the above-mentioned EI shape and may be of any desired conventionally-known type, such as the EE shape.

It should be appreciated that the construction of the CMC coil 1, such as the shape of the core 2 constituting the CMC coil 1 and how to wind the windings relative to the core 2, is not limited to the ones shown in FIG. 4A to FIG. 4D; the CMC coil 1 may be constructed in any other desired manner (e.g., the core 2 may have any other desired shape, and the windings may be wound in any other desired manner) as long as it is constructed, in a manner as defined in the appended claims, in such a manner that magnetic fluxes produced in the core 2 are canceled out with respect to normal output signals of the class-D amplifiers 10 and 20 no matter whether the power amplifier is used in the single-end connection mode or in the BTL connection mode. Namely, the CMC coil 1 having the electro-magnetic characteristics described above can be achieved by such a construction that the CMC coil 1 has four coils 3-6 wound on the common core 2 in the same direction, the hot-side outputs 18, 28 of the first and second class-D amplifiers 10, 20 are connected to respective ones of the first ends of two coils 3 and 5 of the four coils 3-6, the first and second hot-side output terminals 16, 26 are connected to respective ones of the second ends of the two coils 3 and 5, the ground-side outputs 19, 29 of said first and second class-D amplifiers 10, 20 are connected to respective ones of the first ends of remaining two coils 4 and 6 of the four coils 3-6, and the first and second ground-side output terminals 17, 27 are connected to respective ones of the second ends of the remaining two coils 4 and 6.

As described above, with the simple construction comprising two class-D amplifiers and the CMC coil 1, including the four windings (coils) 3-6 wound on the single common core 2, provided in the output sections of the first class-D amplifier 10 and second class-D amplifier 20, the embodiment of the power amplifier can achieve the superior advantageous benefit of being able to remove common mode noise, included in the output signals of the class-D amplifiers 10 and 20, by means of the common mode choke coil 1, no matter whether the power amplifier is used in the single end connection mode or in the BTL connection mode. Further, the common mode choke coil 1 employed in the instant embodiment can be implemented by the simple construction merely comprising the four windings 3-6 wound on the single core 2 in the same direction. Further, the user can select the single-end connection or the BTL connection by performing simple operation of selecting an appropriate combination of the terminals to be used for connecting the load (loads) to the power amplifier.

This application is based on, and claims priority to, JP PA 2008-202927 filed on 6 Aug. 2008. The disclosure of the priority application, in its entirety, including the drawings, claims, and the specification thereof, is incorporated herein by reference.

What is claimed is:

1. A power amplifier having class-D amplifiers of two channels built therein, comprising:

a first class-D amplifier including a low-pass filter provided in an output section thereof;
a first hot-side output terminal;
a first ground-side output terminal;
a second class-D amplifier including a low-pass filter provided in an output section thereof;
a second hot-side output terminal;
a second ground-side output terminal; and
a common mode choke coil device including four coils wound on a common core in a same direction, each of the four coils having first and second ends,
wherein hot-side outputs of the first and second class-D amplifiers are connected to respective ones of the first ends of two of the four coils, and the first and second hot-side output terminals are connected to respective ones of the second ends of the two coils, and
wherein ground-side outputs of said first and second class-D amplifiers are connected to respective ones of the first ends of remaining two of the four coils, and the first and second ground-side output terminals are connected to respective ones of the second ends of the remaining two coils.

2. The power amplifier as claimed in claim 1 wherein the magnetic core has a structure constituting a single common magnetic circuit.

3. The power amplifier as claimed in claim 2 wherein the magnetic core is any one of a single toroidal-shaped core, CI-shaped core, UI-shaped core and CC-shaped core.

4. The power amplifier as claimed in claim 1 wherein the magnetic core has a structure constituting a plurality of magnetic circuits.

5. The power amplifier as claimed in claim 4 wherein the magnetic core is an EI-shaped core or EE-shaped core.

6. The power amplifier as claimed in claim 1 wherein two independent sound signals are supplied to the first and second class-D amplifiers, respectively, and
wherein a first load is connected between the first hot-side output terminal and the first ground-side output terminal, and a second load is connected between the second hot-side output terminal and the second ground-side output terminal.

7. The power amplifier as claimed in claim 1 wherein a sound signal and an inverted signal of the sound signal are supplied to the first and second class-D amplifiers, respectively, and
wherein a single load is connected between the first and second hot-side output terminals.

8. A common mode choke coil device for connection to output sections of a first class-D amplifier and a second class-D amplifier, comprising:
a common core;
four coils wound on the common core in a same direction, each of the four coils having first and second ends,
wherein hot-side outputs of the first and second class-D amplifiers are connected to respective ones of the first ends of two of the four coils, and the first and second hot-side output terminals are connected to respective ones of the second ends of the two coils, and
wherein ground-side outputs of said first and second class-D amplifiers are connected to respective ones of the first ends of remaining two of the four coils, and the first and second ground-side output terminals are connected to respective ones of the second ends of the remaining two coils.

9. The common mode choke coil device as claimed in claim 8 wherein the magnetic core has a structure constituting a single common magnetic circuit.

10. The common mode choke coil device as claimed in claim 9 wherein the magnetic core is any one of a single toroidal-shaped core, CI-shaped core, UI-shaped core and CC-shaped core.

11. The common mode choke coil device as claimed in claim 8 wherein the magnetic core has a structure constituting a plurality of magnetic circuits.

12. The common mode choke coil device as claimed in claim 11 wherein the magnetic core is an EI-shaped core or EE-shaped core.

13. The common mode choke coil device as claimed in claim 8 wherein two independent sound signals are supplied to the first and second class-D amplifiers, respectively, and wherein a first load is connected between the first hot-side output terminal and the first ground-side output terminal, and a second load is connected between the second hot-side output terminal and the second ground-side output terminal.

14. The common mode choke coil device as claimed in claim 8 wherein a sound signal and an inverted signal of the sound signal are supplied to the first and second class-D amplifiers, respectively, and wherein a single load is connected between the first and second hot-side output terminals.

* * * * *